(12) United States Patent
Haba et al.

(10) Patent No.: US 10,211,160 B2
(45) Date of Patent: Feb. 19, 2019

(54) MICROELECTRONIC ASSEMBLY WITH REDISTRIBUTION STRUCTURE FORMED ON CARRIER

(71) Applicant: Invensas Corporation, San Jose, CA (US)

(72) Inventors: Belgacem Haba, Saratoga, CA (US); Wael Zohni, San Jose, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/257,152

(22) Filed: Sep. 6, 2016

(65) Prior Publication Data

US 2017/0069575 A1 Mar. 9, 2017

Related U.S. Application Data (60) Provisional application No. 62/215,683, filed on Sep. 8, 2015.

(51) Int. Cl.
*H01L 21/56* (2006.01)
*H01L 23/538* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC .............. H01L 23/3128; H01L 21/561; H01L 2924/15311; H01L 2224/97; H01L 2224/16225
(Continued)

(56) References Cited

U.S. PATENT DOCUMENTS

| 5,847,936 A | 12/1998 | Forehand et al. |
| 6,064,114 A | 5/2000 | Higgins, III |

(Continued)

FOREIGN PATENT DOCUMENTS

| DE | 19904258 A1 | 12/1999 |
| WO | 2013172814 A1 | 11/2013 |
| WO | 2014066153 A1 | 5/2014 |

OTHER PUBLICATIONS

International Search Report and Written Opinion for Application No. PCT/US2014/018057 dated May 8, 2014.
(Continued)

*Primary Examiner* — Marc Armand
*Assistant Examiner* — Sue Tang
(74) *Attorney, Agent, or Firm* — Lerner, David, Littenberg, Krumholz & Mentlik, LLP (57) ABSTRACT

A microelectronic assembly can be made by forming a redistribution structure supported on a carrier, the structure including two or more layers of deposited dielectric material and two or more electrically conductive layers and including conductive features such as pads and traces electrically interconnected by vias. Electrical connectors may project above a second surface of the structure opposite an interconnection surface of the redistribution structure adjacent to the carrier. A microelectronic element may be attached and electrically connected with conductive features at the second surface, and a dielectric encapsulation can be formed contacting the second surface and surfaces of the microelectronic element. Electrically conductive features at the interconnection surface can be configured for connection with corresponding features of a first external component, and the electrical connectors can be configured for connection with corresponding features of a second external component.

6 Claims, 9 Drawing Sheets

(51) Int. Cl.
*H01L 21/48* (2006.01)
*H01L 25/10* (2006.01)
*H01L 25/00* (2006.01)
*H01L 23/31* (2006.01)

(52) U.S. Cl.
CPC ........ *H01L 21/4857* (2013.01); *H01L 21/568* (2013.01); *H01L 23/5383* (2013.01); *H01L 23/5384* (2013.01); *H01L 23/5386* (2013.01); *H01L 25/105* (2013.01); *H01L 25/50* (2013.01); *H01L 21/561* (2013.01); *H01L 23/3128* (2013.01); *H01L 2224/16225* (2013.01); *H01L 2224/97* (2013.01); *H01L 2225/1035* (2013.01); *H01L 2225/1041* (2013.01); *H01L 2225/1058* (2013.01); *H01L 2924/15311* (2013.01)

(58) Field of Classification Search
USPC .......................................................... 257/668
See application file for complete search history.

(56) References Cited

U.S. PATENT DOCUMENTS

| | | | |
|---|---|---|---|
| 6,150,724 A | 11/2000 | Wenzel et al. | |
| 6,285,079 B1 | 9/2001 | Kunikiyo | |
| 6,391,220 B1 | 5/2002 | Zhang et al. | |
| 6,610,934 B2 | 8/2003 | Yamaguchi et al. | |
| 6,711,813 B1 | 3/2004 | Beyne et al. | |
| 6,747,350 B1 | 6/2004 | Lin et al. | |
| 6,789,034 B2 | 9/2004 | Freed | |
| 6,879,034 B1 | 4/2005 | Yang et al. | |
| 7,084,487 B1 | 8/2006 | Conn | |
| 7,193,311 B2 * | 3/2007 | Ogawa | H01L 21/6835 257/678 |
| 7,235,477 B2 | 6/2007 | Ogawa | |
| 7,791,199 B2 | 9/2010 | Grinman et al. | |
| 7,882,628 B2 | 2/2011 | Muthukumar et al. | |
| 7,902,661 B2 | 3/2011 | Smeys et al. | |
| 8,105,875 B1 | 1/2012 | Hu et al. | |
| 8,125,065 B2 | 2/2012 | Lee | |
| 8,198,724 B1 | 6/2012 | Wu et al. | |
| 8,486,758 B2 | 7/2013 | Oganesian et al. | |
| 8,952,516 B2 | 2/2015 | Zohni et al. | |
| 9,024,205 B2 | 5/2015 | Uzoh | |
| 9,257,396 B2 | 2/2016 | Uzoh | |
| 9,437,536 B1 | 9/2016 | Wang et al. | |
| 9,570,410 B1 | 2/2017 | Chang et al. | |
| 2002/0045293 A1 | 4/2002 | Tsunoi | |
| 2002/0079591 A1 | 6/2002 | Sakiyama et al. | |
| 2004/0080036 A1 | 4/2004 | Chang et al. | |
| 2004/0264837 A1 | 12/2004 | Ogawa | |
| 2005/0067680 A1 | 3/2005 | Boon et al. | |
| 2005/0260794 A1 | 11/2005 | Lo et al. | |
| 2006/0033210 A1 | 2/2006 | Chauhan et al. | |
| 2011/0126408 A1 | 6/2011 | Antesberger et al. | |
| 2011/0127664 A1 | 6/2011 | Antesberger et al. | |
| 2011/0133333 A1* | 6/2011 | Kwon | H01L 21/76898 257/737 |
| 2011/0133342 A1 | 6/2011 | Arai | |
| 2012/0133001 A1* | 5/2012 | Tkaczyk | H01L 27/20 257/414 |
| 2012/0139094 A1 | 6/2012 | Haba et al. | |
| 2012/0319295 A1 | 12/2012 | Chi et al. | |
| 2013/0075889 A1 | 3/2013 | Pagaila et al. | |
| 2013/0083583 A1 | 4/2013 | Crisp et al. | |
| 2013/0093087 A1 | 4/2013 | Chau et al. | |
| 2013/0127054 A1 | 5/2013 | Muthukumar et al. | |
| 2013/0203240 A1* | 8/2013 | Reed | H01L 22/20 438/464 |
| 2013/0264704 A1 | 10/2013 | Pendse | |
| 2013/0313012 A1 | 11/2013 | Yang et al. | |
| 2014/0070423 A1 | 3/2014 | Woychik et al. | |
| 2014/0159247 A1 | 6/2014 | Lyne et al. | |
| 2014/0217617 A1 | 8/2014 | Haba et al. | |
| 2014/0231984 A1 | 8/2014 | Chen | |
| 2014/0240938 A1 | 8/2014 | Newman et al. | |
| 2014/0312490 A1 | 10/2014 | Yang et al. | |
| 2015/0235991 A1* | 8/2015 | Gu | H01L 25/0655 257/762 |
| 2015/0255361 A1 | 9/2015 | Lee et al. | |
| 2015/0259194 A1 | 9/2015 | Lin et al. | |
| 2015/0327367 A1 | 11/2015 | Shen et al. | |
| 2015/0348940 A1 | 12/2015 | Woychik et al. | |
| 2016/0172317 A1* | 6/2016 | Tsai | H01L 23/66 257/428 |
| 2016/0190098 A1 | 6/2016 | Chen et al. | |
| 2016/0300817 A1 | 10/2016 | Do et al. | |
| 2016/0329267 A1 | 11/2016 | Huang et al. | |

OTHER PUBLICATIONS

International Search Report and Written Opinion for Application No. PCT/US2014/067496 dated Feb. 18, 2015.
International Search Report and Written Opinion for Application No. PCT/US2016/031207 dated Jul. 21, 2016.
International Search Report and Written Opinion for Application No. PCT/US2016/031259 dated Jul. 21, 2016.
U.S. Appl. No. 62/159,136, filed May 8, 2015.

\* cited by examiner

MICROELECTRONIC ASSEMBLY WITH REDISTRIBUTION STRUCTURE FORMED ON CARRIER

CROSS-REFERENCE TO RELATED APPLICATIONS

The present application claims the benefit of the filing date of U.S. Provisional Application No. 62/215,683 filed Sep. 8, 2015, the disclosure of which is hereby incorporated herein by reference.

BACKGROUND

Technical Field

The present application relates to microelectronic assembly and package and more particularly to microelectronic packaging having a redistribution structure.

Description of the Related Art

Multi-die packages and multi-die assemblies which incorporate silicon interposers can be used to provide high speed, high bandwidth or a high degree of parallel interconnections between multiple microelectronic elements, e.g., semiconductor dies, or semiconductor dies having additional wiring thereon, which are arranged side by side above a surface of a common interposer. Silicon interposers are typically formed from a relatively thick wafer in which wiring patterns and contacts are fabricated in a thin layer of the silicon wafer and above the thin layer, after which the bulk of the wafer is ground down or otherwise discarded. As silicon wafers are almost exclusively processed using semiconductor processing equipment in clean rooms, such processing and the discarding of the unneeded bulk wafer can make silicon interposers more expensive and more difficult to fabricate than other types of circuit structures.

In addition, the horizontal area of such multi-die package can be large, and may constrain further miniaturization of a system such as smart phone, tablet, phablet or other handheld device or personal computer in which the multi-chip package is incorporated.

Figure 1:
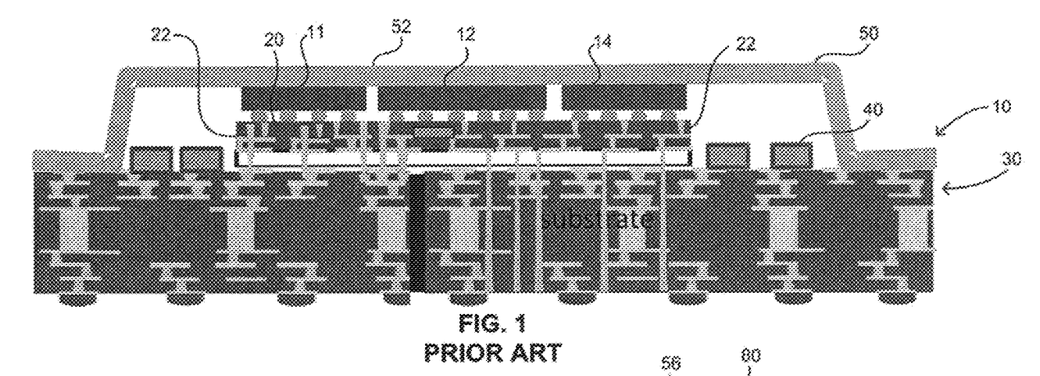
FIG. 1 depicts a multi-chip package or microelectronic assembly in accordance with the prior art.

For example, in the prior art multi-chip package 10 seen in FIG. 1, microelectronic elements 11, 12 and 14 overlie and are electrically interconnected with one another by silicon interposer 20 and are electrically interconnected with a substrate 30 through the silicon interposer 20. Electrical coupling of the silicon interposer with an underlying substrate 30 can be provided through electrically conductive features such as vias which formed typically by drilling through multiple levels of contacts and depositing a metal therein such as by electroless or electrolytic plating or, alternatively, physical or chemical vapor deposition processes.

Auxiliary components such as passive components 40, e.g., decoupling capacitors, and/or resistors can be electrically coupled to the substrate 30 outside the horizontal area of the silicon interposer 20, that is, beyond edges 22 of the silicon interposer. Such components 40 can cooperate with the microelectronic elements 11, 12, 14 of the assembly to provide improved function. As further seen in FIG. 1, a thermally conductive element, i.e., a heat spreader 50, can be thermally coupled to rear surfaces 52 of the microelectronic elements. The heat spreader may also serve as a protective cover for the assembly and the components 40 therein.

Figure 2:
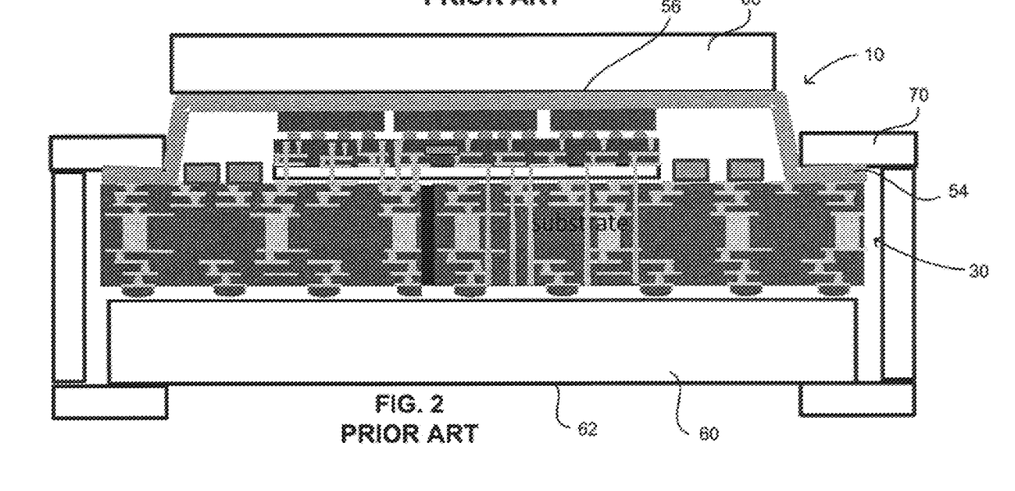
FIG. 2 depicts the multi-chip package as further coupled with additional electronic components in accordance with the prior art.

FIG. 2 further illustrates electrical and mechanical interconnection of the multi-chip package 10 within a system such as described above. For example, the multi-chip package 30 can be mounted on and electrically connected with a circuit panel 60 through solder balls 62. Clamps 70 may engage the package 10 at a foot portion 54 of the heat spreader and an outwardly facing surface 62 of the circuit panel 60. A further component 80 such as a housing, heat sink, cold plate, cooling duct, or fan can be thermally coupled to a surface 56 of the heat spreader which faces away from the microelectronic elements.

Further improvements in the structure and fabrication of a multi-die package or multi-die assembly, as well as the horizontal area occupied thereby, would be desirable.

DETAILED DESCRIPTION

A microelectronic assembly can be made by forming a redistribution structure supported on a carrier, the structure including two or more layers of deposited dielectric material and two or more electrically conductive layers and including conductive features such as pads and traces electrically interconnected by vias. Electrical connectors may project above a second surface of the structure opposite an interconnection surface of the redistribution structure adjacent to the carrier. A microelectronic element may be attached and electrically connected with conductive features at the second surface, and a dielectric encapsulation can be formed contacting the second surface and surfaces of the microelectronic element. Electrically conductive features at the interconnection surface can be configured for connection with corresponding features of a first external component, and the electrical connectors can be configured for connection with corresponding features of a second external component.

In a particular embodiment, a method of fabricating a microelectronic assembly may include: forming a redistribution structure supported on a carrier by forming two or more layers of deposited dielectric material and two or more electrically conductive layers thereon each electrically conductive layer comprising electrically conductive features including at least one of contacts or traces supported by the layers of deposited dielectric material, the electrically conductive layers electrically interconnected through vias; singulating the carrier with the redistribution structure supported thereon into individual units, each unit containing a singulated portion of the carrier; joining electrically conductive features at a second surface of the redistribution structure opposite from the carrier with corresponding contacts at a first surface of a substrate which are juxtaposed with the conductive features; and then removing the singulated portions of the carrier overlying an interconnection surface of the redistribution structure. Electrically conductive features at the interconnection surface may be configured for connection with corresponding features of a first external component.

As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

Figure 3A:
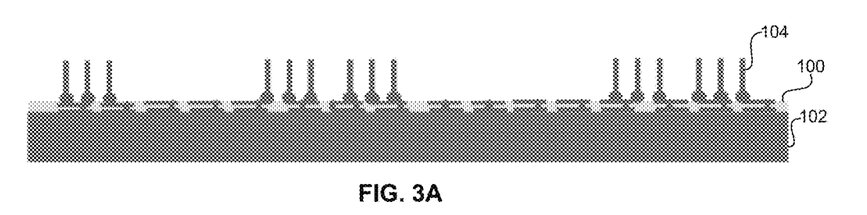
FIGS. 3A, 3B, 3C, 4 and 5 illustrate stages in a method of fabricating a microelectronic assembly in accordance with an embodiment disclosed herein.

A method of fabricating a microelectronic assembly will now be described relative to FIGS. 3A through 5. As seen in FIG. 3A, a redistribution structure 100 is supported on a carrier 102, either directly thereon, or through an intervening layer (not shown) which may be a peelable or other sacrificial layer. The carrier can include or be made of glass, metal, silicon, or other relatively rigid material which can be removed by subsequent processing. The redistribution structure can be referred to as a "circuit structure" made of a plurality of dielectric layers and electrically conductive features thereon, as described generally in U.S. Provisional Application 62/159,136, the disclosure of which is incorporated by reference herein. In one example, the circuit structure may have a maximum thickness of less than 10 micrometers in a direction normal to the first surface of the circuit structure. The electrically conductive features may comprise a plurality of bumps at a first surface of the circuit structure facing the contacts of the dielectric element and joined thereto, a plurality of circuit structure contacts at a second surface opposite the first surface. The circuit structure may further include a plurality of traces, wherein the bumps and the circuit structure contacts are electrically coupled by the traces.

The dielectric material of the dielectric layers is a material which can be deposited and patterned to form structures which support metallization thereon at a pitch of less than 2 micrometers, less than 1 micrometer, at least as low as 0.2 micrometers. In particular examples, the dielectric material can be deposited by chemical vapor deposition ("CVD"), spray coating, spin coating, roller coating, dipping, or the like. In particular examples, the dielectric material can be a photosensitive polymer, e.g., benzocyclobutene ("BCB")-based material, or other photosensitive material. In one example, the redistribution structure has a maximum thickness T of less than 10 micrometers in a direction normal to the first surface 121 of the circuit structure.

In one example, electrically conductive features of a first layer of the redistribution structure can be formed on the carrier at a finest pitch first, and thereafter, features having a less fine pitch are formed, which in some cases can be followed by forming features which have a pitch that is even less fine than the pitch of the previously formed features. In this way, features adjacent to the carrier can be suitable for interconnection with a component, e.g., a semiconductor die or other microelectronic element having a fine pitch connection interface, such that when the carrier is eventually removed, such features are then exposed and available to be connected with the microelectronic element.

At a second surface of the redistribution structure a plurality of upwardly extending electrical connectors 104 are formed, attached, or otherwise provided. In one embodiment, the electrical connectors 104 can be wire bonds, have unbonded free ends remote from the redistribution structure as depicted in FIG. 1, such connectors referred to herein as "wire bond via connectors".

Figure 3B:
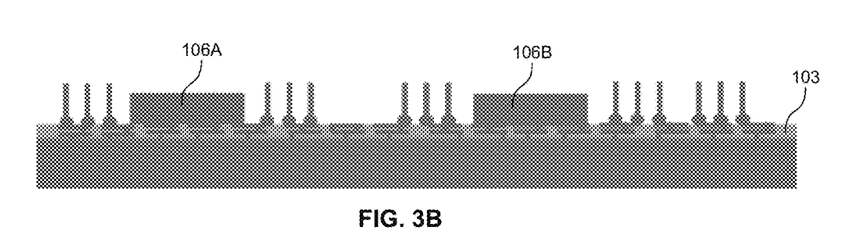

As further shown in FIG. 3B, a microelectronic element, e.g., a bare semiconductor die, or a die having electrical circuitry on a face thereof, is attached at a second surface 103 of the redistribution structure. In one example, the die 106A can be flip-chip attached to the redistribution structure. In another example, the die 106B can be face-up wire bonded to the redistribution structure. In a particular example, the die may include a memory storage array or other circuitry which may be advantageous to include in a microelectronic package or assembly which includes a processor element, as will be described further below.

Figure 3C:
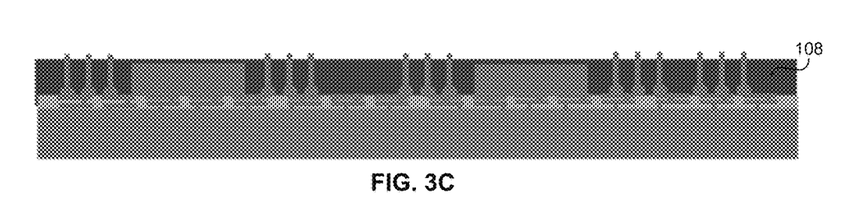

As seen in FIG. 3C, a dielectric encapsulation 108 is provided covering at least edge surfaces of the microelectronic elements while permitting electrical connections to the electrical connectors 104, e.g., wire bond via connectors. The encapsulation can occupy spaces between individual posts of the structure and/or can occupy spaces between one or more groups of posts and one or more other posts of the structure. In one example, the dielectric encapsulation can be formed by flowing an encapsulant into a mold onto the elements shown in FIG. 3B to form a molded encapsulation. Ends of wire bonds can be exposed, for example, using a film-assisted molding technique, or by flashing, etching or other process of removing material of the dielectric encapsulation from the surface after forming the encapsulation. In one example, the encapsulation can be formed using an epoxy or other resin material with a dielectric or semiconductor particulate loading material therein. Such material can help provide a relatively rigid encapsulation 108 which supports planarity of the structure. Such encapsulation may in some cases also help resist strain due to mismatch between coefficients of thermal expansion between the encapsulation and a microelectronic element which can be attached and electrically connected thereto, such as in a flip-chip connection.

Figure 4:
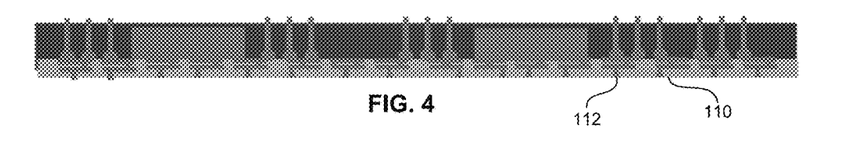

Thereafter, as seen in FIG. 4, the carrier is removed from the encapsulated assembly, which exposes an interconnection surface 110 of the redistribution structure and electrically conductive features 112 thereat. As further seen in FIG. 5, the encapsulated assembly is singulated into individual units 10.

Figure 5:
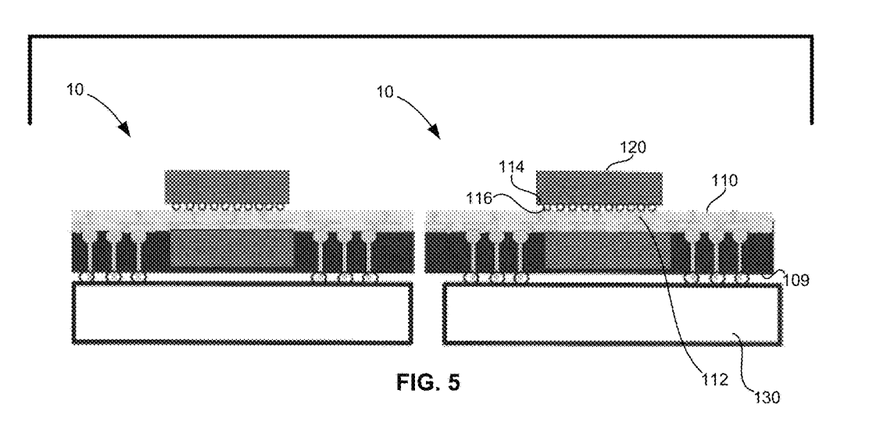
Figure 6:
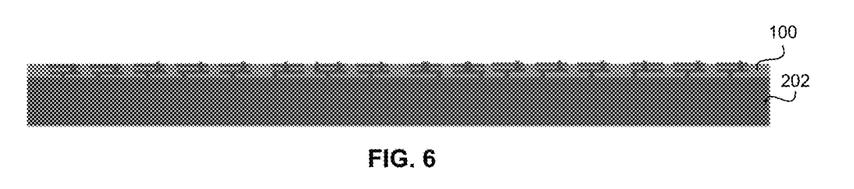
FIGS. 6, 7, 8, 9 and 10 illustrate stages in a method of fabricating a microelectronic assembly in accordance with another embodiment disclosed herein.
Figure 7:
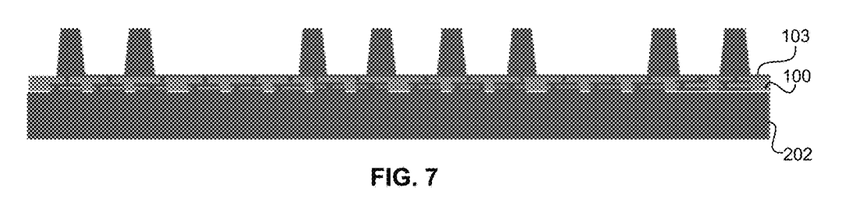

Such features 112 at the interconnection surface 110 are configured for connection with corresponding features of a first external component. For example, as seen in FIG. 5, the electrically conductive features are joined to corresponding contacts (not shown) at a surface 114 of another microelectronic element 120 which is juxtaposed with the interconnection surface 110, such as through bumps 116, thus providing a flip-chip interconnection. In one example, the microelectronic element 120 is a processor. In some examples, processors have a large number of fine-pitch contacts at the surface 114, which accordingly benefits from an interconnection surface having a high degree of planarity and rigidity. In one example, the encapsulation may be used to withstand stresses in operation due to differential thermal expansion between the dielectric encapsulation and the microelectronic element. The thin redistribution structure, which can have fine pitch features thereon, and the rigidity provided by the dielectric encapsulation can help serve this need.

Similarly, the electrical connectors at the surface 109 of the encapsulation are configured for connection with corresponding features of a second external component 130, e.g., a circuit panel, as seen in FIG. 5. In another example, the second external component can be another microelectronic package. While not specifically shown in the FIGS., an additional redistribution structure can be provided at surface 109, which can include electrically conductive traces configured to fan-in or fan-out the contacts available for connection relative to the positions of the electrical connectors 104. Moreover, though a solder ball is shown, a direct bonded interconnect (e.g., DBI®), eutectic bonding, or other non-solder based interconnection is possible.

Referring to FIGS. 6-10, in a variation of the above-described embodiment, a redistribution structure 100 is formed supported on a carrier 202 (FIG. 6), but metal posts 204 are provided as the electrical connectors. In one example, the posts 204 can be formed by etching a metal sheet coupled with and overlying a surface of the redistribution structure 100 opposite from the carrier 202. In one example, the process of fabricating the redistribution structure is the same as described relative to FIG. 3A above, except that the electrical connectors 204 are formed on the redistribution structure 100 by coupling a metal sheet (not shown) with an exposed surface 103 of the redistribution structure 100, and then patterning the metal sheet by etching or other process of removing metal from the metal sheet, thereby providing the structure seen in FIG. 7.

In another example, the redistribution structure 100 can be formed on a metal sheet 102 in an arrangement as shown in FIG. 3A wherein the metal sheet supports the redistribution structure as a first carrier 102. Then, an additional carrier can be provided on or coupled with the oppositely facing surface of the redistribution structure 100 which is opposite from the first carrier 102. Thereafter, with the redistribution structure supported on the second carrier 202, the posts 204 are patterned by etching or other process of removing material from the metal sheet 102.

Figure 8:
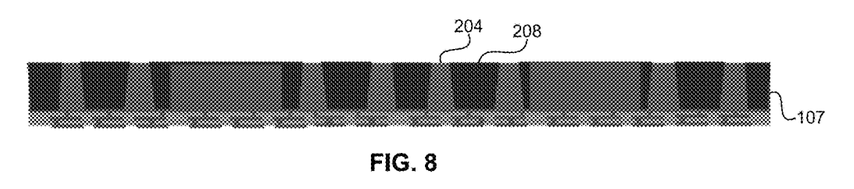

FIG. 8 depicts an example in which surfaces of the posts 204 themselves are exposed at a surface 208 of the dielectric encapsulation which surrounds and fills spaces between individual posts and/or groups of individual posts of the structure.

Figure 9:
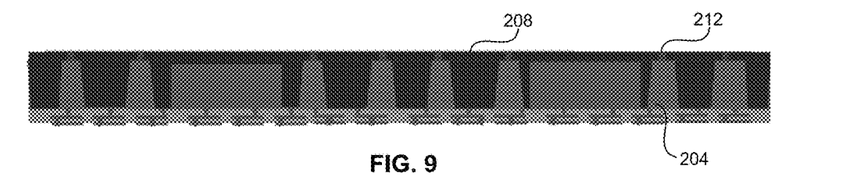

FIG. 9 depicts an alternative example in which electrical connections to the posts 204 are provided through electrically conductive vias 212 which extend through openings in the encapsulation to top surfaces of the posts 204. Such vias can be formed, for example, by forming openings in the encapsulation and then depositing an electrically conductive material therein, which material can also be used to form electrically conductive features, e.g., traces, additional pads, etc., at the surface 208 of the encapsulation.

Figure 10:
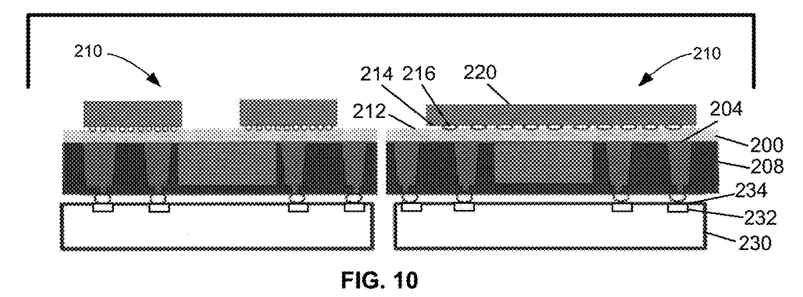
Figure 11:
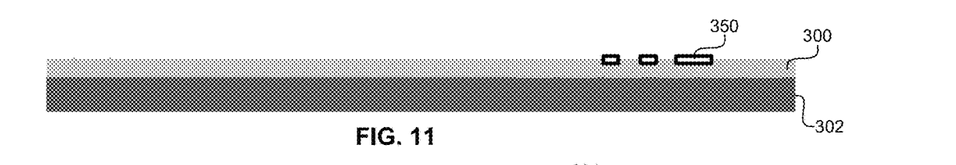
FIGS. 11, 12, 13, 14, 15, 16 and 17 illustrate stages in a method of fabricating a microelectronic assembly in accordance with another embodiment disclosed herein.

FIG. 10 illustrates examples of assemblies formed in such manner, each assembly 210 incorporating one or more additional microelectronic elements and one or more second components such as circuit panels 230, the posts 204 being joined with corresponding contacts 232 at a first surface 234 of each of the circuit panels. FIG. 10 also illustrates a redistribution structure 200 similar to the redistribution structure 100, a dielectric encapsulation 208 surrounding the posts 204, and electrically conductive features 212 that are joined to a surface 214 of a microelectronic element 220 by bumps 216.

Figure 12:
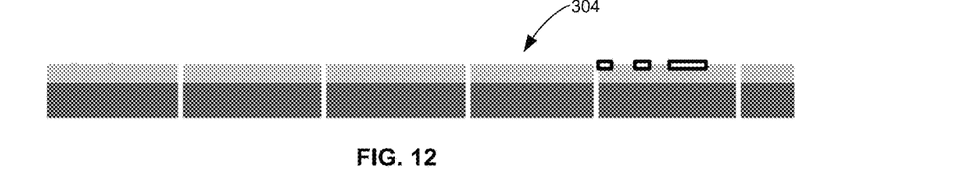

Referring to FIGS. 11-17, in another embodiment, after forming the redistribution structure 300 supported on a carrier 302, (FIG. 11), the carrier with the redistribution structure 300 thereon is singulated into individual units 304, as seen in FIG. 12.

Figure 13:
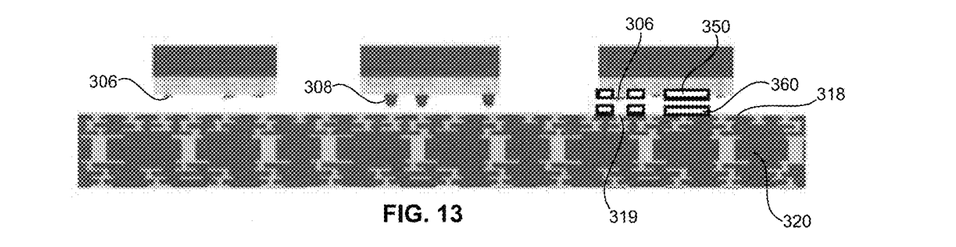

Thereafter, as seen in FIG. 13, each unit is inverted such that a surface of the redistribution structure is juxtaposed with a surface 318 of a substrate 320, e.g., a dielectric element having one or more dielectric layers and electrically conductive layers thereon. The redistribution structure has a plurality of contacts 306, which may be or include, e.g., pads, or posts 308. In one example, the posts 308 may be solid metal posts, such as copper posts or bumps 308 formed by plating or by etching a metal sheet.

Figure 14:
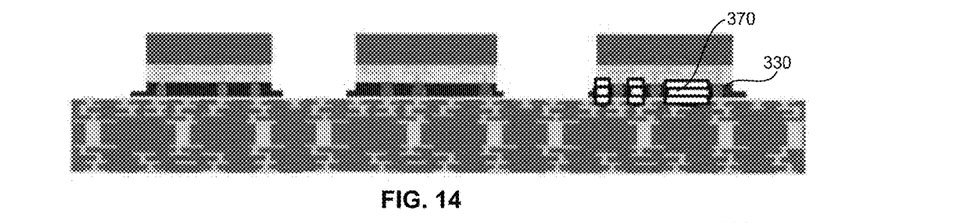
Figure 15:
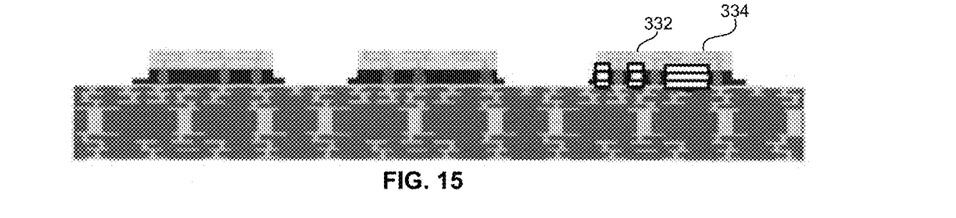

Referring to FIGS. 13 and 14, these contacts 306 of the redistribution structure are joined to corresponding contacts 319 of the substrate 320 which are juxtaposed therewith, such as through solder. Optionally, an underfill 330 can be provided between the juxtaposed surfaces of the redistribution structure and the substrate, such as for the purpose of mechanically reinforcing electrical connections between the redistribution structure and the substrate, to provide a moisture barrier, or for both such purposes. As seen in FIG. 15, the singulated portions of the carrier are then removed, leaving an interconnection surface 332 exposed with electrically conductive features 334 thereat suitable for connection with another electronic component, which may be a microelectronic element.

Use of solid, substantially rigid metal posts, e.g., copper posts, as the contacts interconnecting the redistribution structure and the substrate advantageously help provide an interconnection surface 332 having a high degree of planarity when used for making interconnections having relatively fine pitch. This may be because solder volumes contacting the metal posts 308 may be made smaller than solder used without the underlying posts. Thus, the solder applied to the posts may not compress as much as solder used alone in a structure such as seen in FIG. 15, such as due to the underfill 330 or forces seen in operation such as due to differential thermal expansion.

Figure 16:
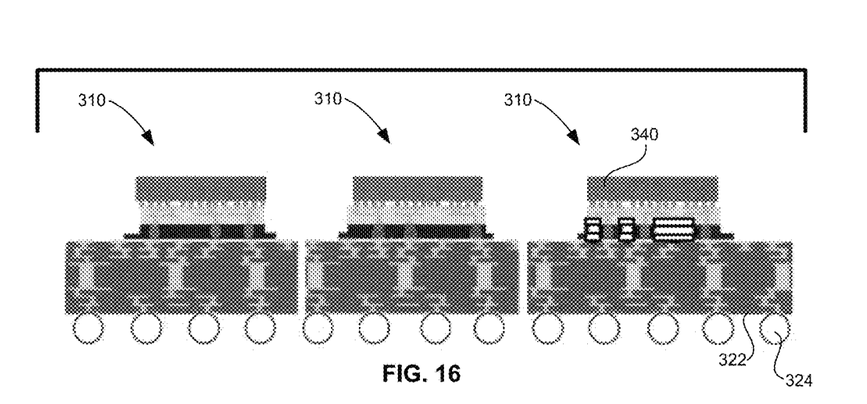
Figure 17:
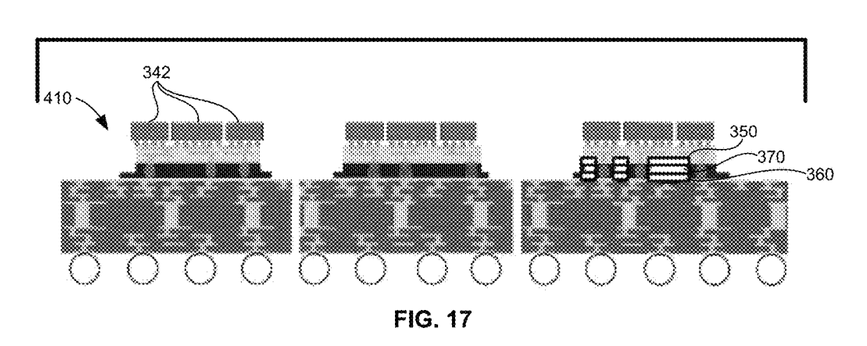

Finally, FIG. 16 illustrates a plurality of resulting assemblies 310 each having an additional microelectronic element 340 flip-chip interconnected to the interconnection surface of the redistribution structure. In addition, joining elements 324, e.g., solder balls, may be provided at a surface 322 of the substrate opposite the redistribution structure, such as for interconnection with another component such as a circuit panel, for example FIG. 17 illustrates a variation of the above in which a plurality of microelectronic elements 342 are flip-chip attached and electrically interconnected to the redistribution structure of each assembly 410.

In a variation of the fabrication process illustrated in FIGS. 11-17 and as further seen therein, the redistribution structure may further include first metal layer features 350 at the second surface of the redistribution structure 300, and the substrate 320 may further include second metal layer features 360 at the first surface of the substrate. These first metal layer features and second metal layer features are utilized in joining the redistribution structure and the substrate with one another. The first metal layer features and second metal layer features may be configured for connection with one of ground, a power supply voltage, or to be at a floating electrical potential, since they typically will not be used for conducting signals between the redistribution structure and the substrate.

Typically, each of the first metal layer features and the second metal layer features has one or more dimensions that are larger than the corresponding one or more dimensions of other electrically conductive features, e.g., pads, contacts, posts, etc. at the facing surface of the redistribution structure and the substrate, respectively. In one embodiment, the first and second dimensions of the first metal layer features and the second metal layer features at the respective surfaces are larger than a minimum pitch of the electrically conductive features at the surface of the redistribution structure.

When the contacts of redistribution structure 300 are bonded with the contacts of the substrate 320, the first metal layer features 350 of the redistribution structure 300 can also be joined with the second metal layer features 360 of the substrate 320 through an electrically conductive bonding material 370, such as for example, solder, tin, or eutectic material or other suitable bonding material. In a particular embodiment, the bonding material may include electrically conductive particles or flakes in a solvent, paste or binder form, wherein the particles or flakes fuse together to form an electrically conductive matrix upon heating the material to a joining temperature.

An example of a structure and process for joining upper and lower generally planar components (e.g., microelectronic elements, package elements, substrates, chip carriers, circuit panels, etc.) through metal layers provided atop surfaces of dielectric materials at surfaces of the upper and lower components is described with reference to FIGS. 1 through 11 of commonly owned U.S. Pat. No. 8,486,758, the disclosure of which is incorporated by reference herein. The additional metal layers 350, 360 are typically supported on and insulated by dielectric material at the surfaces of the redistribution structure and the substrate and extend continuously throughout area at the respective surfaces which extend to first and second dimensions in transverse directions which are greater than a first minimum pitch at which the contacts 306 of the redistribution layer are distributed and which are greater than a second minimum pitch at which the contacts of the substrate are distributed. The metal layers 350, 360 can in some cases be insulated from the contacts 306 of the redistribution structure and from the corresponding contacts 319 of the substrate 320. Alternatively, or in addition thereto, one or more areas, or the entirety of each metal layer 350, 360 can be electrically coupled with one or more of the plurality of contacts 306, 319 of the redistribution structure or substrate, respectively, or both the redistribution structure and the substrate. In one example, areas of or entireties of the metal layers 350, 360 may be electrically coupled with ground or power contacts of the redistribution structure or substrate, respectively, and such areas or entireties of the metal layers 350, 360 may be regulated to a fixed or stable electric potential this way. In addition, in one embodiment the contacts 306, bumps, or posts at the surface of the redistribution structure can be joined with corresponding contacts 319 at the surface of the substrate 320 simultaneously with the joining of the metal layers 350, 360 through masses of the same electrically conductive bonding material as applied to the metal layers 350, 360 for joining those layers.

Thus, in one embodiment, the redistribution structure may include a first metal layer extending continuously throughout an area at the second surface of the redistribution structure, and the substrate further comprises a second metal layer extending continuously throughout an area at the first surface of the substrate, and the joining of the first and second metal layers with one another is performed using an electrically conductive bonding material. The dimensions of the first and second metal layers may be relatively large in comparison with the dimensions and pitches of other electrically conductive features of the redistribution layer and the substrate. Specifically, in one embodiment, the first and second dimensions of the first metal layer in first and second transverse directions along the second surface may be greater than first and second minimum pitches of the electrically conductive features at the second surface in the first and second directions. First and second dimensions of the second metal layer in the first and second transverse directions along the surface of the substrate may be greater than first and second minimum pitches of the contacts at the first surface of the substrate in the first and second directions.

Typically, the joining of the first and second metal layers with one another is performed simultaneously with the joining of the electrically conductive features of the redistribution structure with the corresponding electrically conductive features of the substrate.

Figure 18:
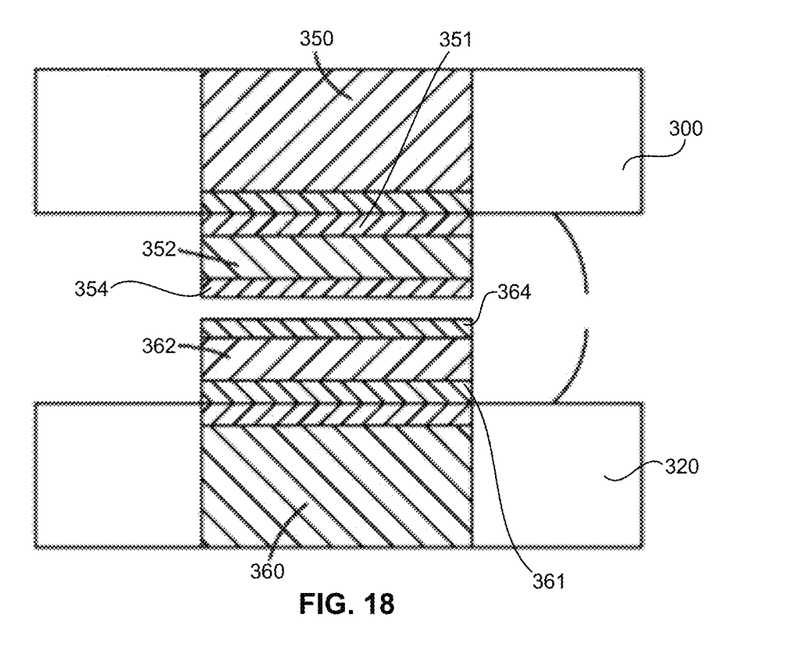
FIGS. 18 and 19 illustrate a particular bonding technique in accordance with a variation of one or more of the embodiments disclosed herein.
Figure 19:
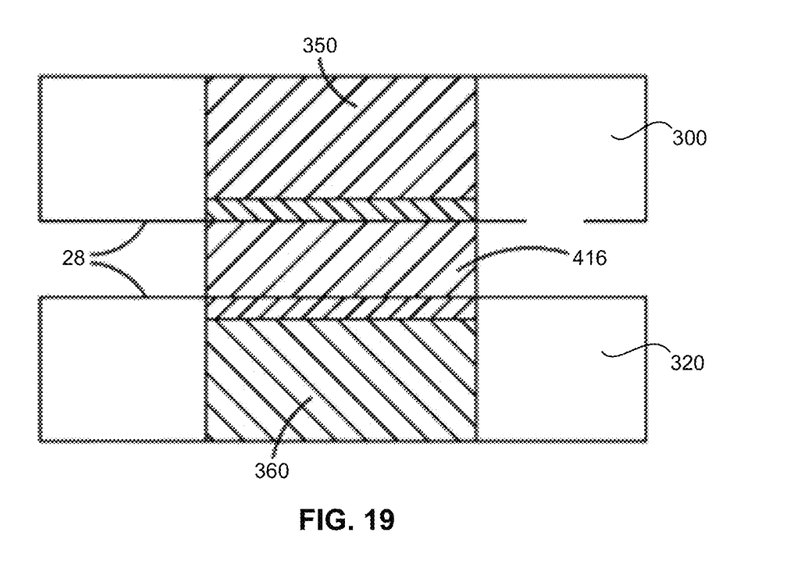

In a particular embodiment, the electrically conductive bonding material used for joining the redistribution structure 300 with the substrate 320 can be a low melting temperature material that forms where dissimilar materials provided at the surfaces of each of the metal layers 350 and 360 meet. Referring to FIGS. 18 and 19, a bonding technique can be used such as described in commonly owned U.S. Pat. No. 9,024,205, the disclosure of which is incorporated herein by reference, wherein dissimilar materials 352, 362 are provided atop each of the metal layers 350, 360 or contacts, such materials being configured to mix and form an alloy mass 416 having a melting temperature which is higher than the temperature at which the dissimilar materials are metallurgically joined by the fusing of the dissimilar materials. Thus, in one example, the two dissimilar LMP materials 352, 362 can be carried out at a first temperature, and the resulting alloy mass 416 can have a melting temperature than is greater than the first temperature. The first and second protective layers can diffuse together and with the first and second material layers during the step of heating to further form the alloy mass 416. The resulting structure can have a spacing 28 between juxtaposed surfaces of the redistribution structure and the substrate as shown in FIG. 19.

In one example, the step of heating can be carried out such that a temperature of the first and second bond components reaches between 30° C. and 200° C. After the step of heating, the electrically conductive alloy mass can have a melting point of between 200° C. and 800° C. Thus, the melting point of the alloy mass may be greater than the melting points of either of the first or second material by at least 30° C.

In one example, the first material layer 352 can include at least one material component not present in the second material layer 362 before the heating step. Each layer 352, 262 may be low melting temperature (LMP) material layers, such as, for example, may include metals selected from one or more of tin, indium, gallium, and/or their respective alloys. Protective layers 354, 364 may overlie the LMP layers 352, 362 to protect against oxidation prior to joining the components together. In one example, the first protective layer 354 may include copper, and the second protective layer 364 can include at least one of copper, nickel, tungsten, cobalt, palladium, boron, gold, silver, and/or their respective alloys. The first and second protective layers can be of a similar composition. FIG. 18 further illustrates seed layers 351, 361 provided between the metal layers or conductive elements 350, 360 and the LMP material layers, respectively.

In a particular example, the resulting electrically conductive alloy mass 416 joined to the first and second conductive elements 350, 360 may include a first material, a second material, and a third material, wherein the third material can be selected to increase the melting point of an alloy including the third material and at least one of the first material or the second material. In the alloy mass, a concentration of the first material can vary from a relatively higher amount at a location disposed toward the first conductive element to a relatively lower amount toward the second conductive element, and a concentration of the second material can vary from a relatively higher amount at a location disposed toward the second conductive element to a relatively lower amount disposed toward the first conductive element. In such alloy mass, a highest concentration of the third material may be at a location within the alloy mass between a location of a highest concentration of the first material and a location of a highest concentration of the second material.

Thus, in one embodiment, the electrically conductive features of the redistribution structure and the electrically conductive features of the substrate comprise first and second dissimilar metals, respectively, wherein the joining comprises heating the redistribution structure and the substrate to a joining temperature at which the first dissimilar metal melts and forms an alloy mass with the second dissimilar metal, wherein the joining temperature is lower than a melting temperature of the alloy mass.

In one embodiment, the electrically conductive features of the redistribution structure and the electrically conductive features of the substrate are joined through alloy masses which comprise a mixture of first and second dissimilar metals, respectively, wherein a melting temperature of the alloy masses is higher than a melting temperature of either of the first and second dissimilar metals. A concentration of the first dissimilar metal in the alloy mass can be characterized by a first gradient decreasing in a direction extending away from the redistribution structure towards the substrate, and a concentration of the second dissimilar metal in the alloy mass can be characterized by a second gradient decreasing in a direction extending away from the substrate towards the redistribution structure.

Figure 20:
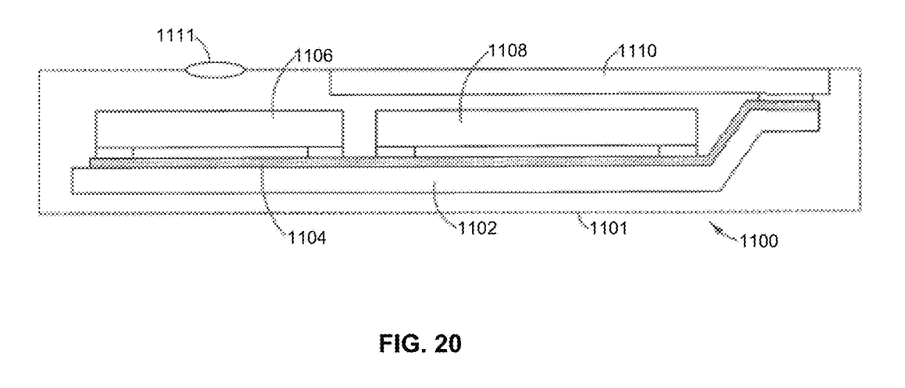
FIG. 20 depicts a system in accordance with an embodiment disclosed herein.

The microelectronic packages and assemblies described above with reference to FIGS. 3 through 19 can be utilized in construction of diverse electronic systems, such as the system 1100 shown in FIG. 20. In specific examples and without limitation, a system may be a tablet, smartphone, other mobile device, or notebook or laptop computer or other type of processor-implemented device or computer. For example, the system 1100 in accordance with a further embodiment may include one or more microelectronic packages or assemblies as described above in conjunction with other electronic components 1108 and 1110.

In the exemplary system 1100 shown, the system can include a circuit panel, motherboard, or riser panel 1102 such as a flexible printed circuit board, and the circuit panel can include numerous conductors 1104, of which only one is depicted in FIG. 20, interconnecting the modules or components 1106 with one another. Such a circuit panel 1102 can transport signals to and from each of the microelectronic packages and/or microelectronic assemblies included in the system 1100. However, this is merely exemplary; any suitable structure for making electrical connections between the modules or components 1106 can be used.

In a particular embodiment, the system 1100 can also another component such as the semiconductor chip 1108 and component 1110 is a display screen, but any other components can be used in the system 1100. Of course, although only two additional components 1108 and 1110 are depicted in FIG. 20 for clarity of illustration, the system 1100 can include any number of such components.

Modules or components 1106 and components 1108 and 1110 can be mounted in a common housing 1101, schematically depicted in broken lines, and can be electrically interconnected with one another as necessary to form the desired circuit. The housing 1101 is depicted as a portable housing of the type usable, for example, in a smartphone or cellular telephone and screen 1110 can be exposed at the surface of the housing. In embodiments where a structure 1106 includes a light-sensitive element such as an imaging chip, a lens 1111 or other optical device also can be provided for routing light to the structure. Again, the simplified system shown in FIG. 20 is merely exemplary; other systems, including systems commonly regarded as fixed structures, such as desktop computers, routers and the like can be made using the structures discussed above.

Although particular embodiments have been disclosed and discussed herein in accordance with the various drawings, it is to be understood that these embodiments are merely illustrative of principles and applications which may be made thereof. It is therefore to be understood that numerous modifications may be made to the illustrative embodiments and that other arrangements may be devised without departing from the spirit and scope of the subject matter defined by the appended claims.

The invention claimed is:

1. A method of fabricating a microelectronic assembly, comprising:
   forming a redistribution structure supported on a carrier by forming two or more layers of deposited dielectric material and two or more electrically conductive layers thereon each electrically conductive layer comprising electrically conductive features including at least one of contacts or traces supported by the layers of deposited dielectric material, the electrically conductive layers electrically interconnected through vias;
   singulating the carrier with the redistribution structure supported thereon into individual units, each unit containing a singulated portion of the carrier;
   joining electrically conductive features at a second surface of the redistribution structure opposite from the carrier with corresponding contacts at a first surface of a substrate which are juxtaposed with the conductive features;
   and then removing the singulated portions of the carrier overlying an interconnection surface of the redistribution structure,
   wherein electrically conductive features at the interconnection surface are configured for connection with corresponding features of a first external component, and
   wherein the electrically conductive features of the redistribution structure and the corresponding contacts of the substrate comprise first and second dissimilar metals, respectively, the joining comprises heating the redistribution structure and the substrate to a joining temperature at which the first dissimilar metal melts and forms an alloy mass with the second dissimilar metal, and the joining temperature is lower than a melting temperature of the alloy mass.

2. The method as claimed in claim 1, further comprising joining contacts at a surface of the first external component to corresponding electrically conductive features which are juxtaposed therewith at the interconnection surface of the redistribution structure.

3. The method as claimed in claim 2, wherein the first external component is at least one microelectronic element.

4. The method as claimed in claim 1, wherein the substrate has a second surface opposite the first surface and includes terminals at the second surface, the terminals configured for connection with contacts of a second external component or circuit panel.

5. The method as claimed in claim 1, wherein the redistribution structure further comprises first metal layer features at the second surface of the redistribution structure, and the substrate further comprises second metal layer features at the first surface of the substrate, the first metal layer features and the second metal layer features being configured for connection with one of ground, a power supply voltage, or to be at a floating electrical potential,     wherein each of the first metal layer features and the second metal layer features has first and second dimensions at the respective surfaces which are larger than a minimum pitch of the electrically conductive features,     wherein the joining further comprises joining the first metal layer features with the second metal layer features another using an electrically conductive bonding material.

6. The method as claimed in claim 5, wherein the joining of the first and second metal layer features with one another is performed simultaneously with the joining of the electrically conductive features of the redistribution structure with the corresponding contacts of the substrate.

\* \* \* \* \*